(12) United States Patent
Yoshida et al.

(10) Patent No.: US 8,291,967 B2
(45) Date of Patent: Oct. 23, 2012

(54) HEAT SINK AND COOLER

(75) Inventors: Tadafumi Yoshida, Nisshin (JP); Hiroshi Osada, Komaki (JP); Yutaka Yokoi, Seto (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 416 days.

(21) Appl. No.: 12/304,891

(22) PCT Filed: Jun. 12, 2007

(86) PCT No.: PCT/JP2007/062197
§ 371 (c)(1),
(2), (4) Date: Dec. 15, 2008

(87) PCT Pub. No.: WO2007/145352
PCT Pub. Date: Dec. 21, 2007

(65) Prior Publication Data
US 2009/0250195 A1 Oct. 8, 2009

(30) Foreign Application Priority Data
Jun. 14, 2006 (JP) ................. 2006-164956

(51) Int. Cl.
*F28F 7/00* (2006.01)
*F28D 15/00* (2006.01)
*H05K 7/20* (2006.01)
(52) U.S. Cl. ... 165/80.4; 361/699; 361/700; 165/104.21
(58) Field of Classification Search ............... 165/80.4, 165/80.3; 361/699, 700, 697, 704, 710
See application file for complete search history.

(56) References Cited

U.S. PATENT DOCUMENTS

| | | | | |
|---|---|---|---|---|
| 4,730,666 A * | 3/1988 | Flint et al. | .......... | 165/80.4 |
| 5,016,090 A * | 5/1991 | Galyon et al. | .......... | 257/714 |
| 5,604,665 A * | 2/1997 | Chrysler et al. | .......... | 361/703 |
| 7,139,172 B2 * | 11/2006 | Bezama et al. | .......... | 361/699 |
| 7,188,662 B2 * | 3/2007 | Brewer et al. | .......... | 165/80.4 |
| 7,568,519 B2 * | 8/2009 | Nakahama | .......... | 165/80.4 |
| 7,806,168 B2 * | 10/2010 | Upadhya et al. | .......... | 165/80.4 |
| 2004/0188066 A1 * | 9/2004 | Upadhya et al. | .......... | 165/80.4 |
| 2005/0211427 A1 * | 9/2005 | Kenny et al. | .......... | 165/299 |
| 2006/0002087 A1 | 1/2006 | Bezama et al. | | |

(Continued)

FOREIGN PATENT DOCUMENTS
DE 102005030517 A1 2/2006
(Continued)

OTHER PUBLICATIONS

Notice of Grounds of Rejection, corresponding to Japanese Patent Application No. 2006-164956, dated Jun. 22, 2010 with English Language Translation.

(Continued)

*Primary Examiner* — Allen Flanigan
*Assistant Examiner* — Jason Thompson
(74) *Attorney, Agent, or Firm* — Sughrue Mion, PLLC (57) ABSTRACT

A heat sink includes a plurality of fins. The fins are formed to serve as partition walls of flow paths of a coolant. The fins are formed such that the coolant flows along a surface thereof. A merge space is formed to allow the coolant in the flow paths separated by the fins to merge. The merge space is formed in the flow paths formed by the fins.

3 Claims, 7 Drawing Sheets

U.S. PATENT DOCUMENTS

2006/0021744 A1   2/2006   Vogel

FOREIGN PATENT DOCUMENTS

| | | |
|---|---|---|
| JP | 05-206339 A | 8/1993 |
| JP | 3010602 U | 2/1995 |
| JP | 09-023081 A | 1/1997 |
| JP | 10-200278 A | 7/1998 |
| JP | 2001-352025 A | 12/2001 |
| JP | 2002-368170 A | 12/2002 |
| JP | 2004-134742 A | 4/2004 |
| JP | 2005-116877 A | 4/2005 |
| JP | 2006-054434 A | 2/2006 |
| JP | 2006-054456 A | 2/2006 |

OTHER PUBLICATIONS

German Office Action dated Mar. 23, 2011 issued in counterpart German Application No. 11 2007 001 424.5-33.

* cited by examiner

HEAT SINK AND COOLER

TECHNICAL FIELD

The present invention relates to a heat sink and a cooler for heat exchange.

BACKGROUND ART

A laser diode for working, a CPU (Central Processing Unit) of a computer, or a power converter such as an inverter generates heat as it is driven. Such a component may be damaged or performance thereof may deteriorate due to heat generated by the component itself. In addition, parts arranged around a heat generator may adversely be affected. Such a heat generator is cooled by a cooler for heat removal.

Some coolers include a heat sink, the heat sink having fins. Fins are formed in the heat sink so that a heat transfer area for radiation increases and hence efficiency in heat exchange can be improved.

Japanese Patent Laying-Open No. 2001-352025 discloses a heat generator cooling device, in which a heat generator is arranged in a heat sink and a coolant water is supplied to a channel group formed of fins of the heat sink and a base. In this heat generator cooling device, an inlet port for supplying the coolant water to the channel group is provided, an inlet side header is provided between the inlet port and the channel group, and an outlet side header is provided downstream of the channel group. According to this disclosure, relation of Wb>Wc>Wa is set, where Wb represents a width of a channel closer to the inlet port, Wc represents a width of a channel farther from the inlet port, and Wa represents a width of a channel in the center. According to the disclosure, this heat generator cooling device can achieve uniform cooling of the heat generator.

Japanese Patent Laying-Open No. 5-206339 discloses a radiator including a plurality of fins on a surface of a base, the fins being arranged at a regular pitch and the fins different in thickness being arranged such that the fin located at an edge of the base is largest in thickness and the fin located at the center of the base is smallest in thickness. According to the disclosure, in this radiator, a uniform flow velocity can be provided to each fin in the radiator and an effect of cooling by the fins can be maximized without increasing a dimension of the radiator as a whole.

Japanese Patent Laying-Open No. 9-23081 discloses a boiling cooling device. The boiling cooling device is disclosed, in which partition walls partitioning a cooling pool into three coolant chambers in correspondence with IGBT (Insulated Gate Bipolar Transistor) modules attached to a surface and a plurality of coolant flow control plates vertically dividing a boiling region of each coolant chamber are provided in the cooling pool. The coolant flow control plates are provided in the boiling region at regular intervals in a vertical direction in an inclined manner. In addition, in each coolant chamber partitioned by the partition walls, an outlet passage through which vapor resulting from boiling flows out is provided on one side of the boiling region, and an inlet passage through which a condensate flows in is provided on the other side thereof. According to the disclosure, this boiling cooling device can prevent lowering in radiation performance on an upper side of the boiling region in the coolant pool.

Japanese Patent Laying-Open No. 2004-134742 discloses a device for cooling electronic components, in which a liquid cooling portion and an air cooling portion are integrally formed and a heat absorption surface of the liquid cooling portion is joined to a heat generating part that locally generates heat. A liquid cooling pump for circulating a coolant through a flow passage is provided in the liquid cooling portion. According to the disclosure, this device for cooling electronic components is excellent in heat conduction efficiency and radiation performance.

Japanese Patent Laying-Open No. 2005-116877 discloses a cooling system, in which a maximum radiation amount of a radiator is not higher than a maximum amount of heat generated by an IGBT. According to the disclosure, the radiator for radiating heat absorbed from a heat generator such as an IGBT can be made smaller in size in the cooling system.

As disclosed, for example, in Japanese Patent Laying-Open No. 2001-352025 above, a cooler in which a flow path of a coolant is formed by fins is available. In this cooler, a space between the fins serves as the flow path of the coolant. In this cooler, heat exchange is carried out while the coolant flows along a main surface of the fin.

In each flow path of the coolant, pressure becomes lower toward downstream because of pressure loss. Here, originating from manufacturing errors or the like, a structure of a flow path may differ. Magnitude of pressure loss in each flow path may differ, which may result in a different flow rate of the coolant that flows through each flow path. Consequently, cooling may not be uniform at the surface of the cooler. For example, when a flow rate transiently fluctuates, variation in pressure loss is different in each flow path and hence it is difficult to achieve a uniform flow rate in the flow paths.

In addition, a boundary layer of the coolant is formed on the surface of the fin. As the boundary layer becomes greater (thicker) toward downstream, heat transfer becomes poorer and cooling capability is lower toward downstream. Therefore, cooling capability may be different between an upstream area and a downstream area of the flow path of the coolant.

In an example where the cooler is a boiling-type cooler, a ratio of gas phase to liquid phase is higher toward downstream of the flow path. Heat transfer becomes poorer and cooling capability becomes lower toward downstream of the flow path. In particular, if a flow rate of the coolant to each flow path is different, a downstream area of the flow path where the flow rate has decreased is extremely short of a liquid coolant and burnout which will be described later is more likely.

Moreover, in the case of a boiling-type cooler, what is called burnout, in which transition from a nucleate boiling state to a film boiling state is made, is more likely toward downstream of the flow path. When burnout occurs, heat transfer becomes poorer. This tendency is more likely as a cross-sectional area of the flow path of the coolant is smaller. For example, in a cooler having a microchannel structure, a flow path has a small diameter and hence the flow path may be blocked by vapor phase. Thus, cooling capability is lower toward downstream.

DISCLOSURE OF THE INVENTION

An object of the present invention is to provide a heat sink and a cooler capable of achieving uniform cooling.

A heat sink according to the present invention includes a plurality of fins. The fins above are formed to serve as partition walls of flow paths of a coolant. The fins above are formed such that the coolant above flows along a surface thereof. A merge space is formed to allow the coolant above in the flow paths above separated by the fins above to merge. The merge space above is formed in the flow paths above formed by the fins above.

In the invention above, preferably, the merge space is formed between regions located directly under a plurality of cooled targets, in a direction of the flow path of the coolant.

In the invention above, preferably, the fins above include a plurality of first fins and a plurality of second fins. The heat sink includes a first fin group arranged such that main surfaces of the plurality of first fins above are in parallel to one another. The heat sink includes a second fin group arranged such that main surfaces of the plurality of second fins above are substantially in parallel to one another. The second fin group above is arranged such that the main surface of the second fin above is substantially in parallel to the main surface of the first fin above. The merge space above is formed by arranging the first fin group above and the second fin group above at a distance from each other.

In the invention above, preferably, cooled targets are arranged inside regions where the first fin group and the second fin group are formed, respectively, and the merge space is formed between the first fin group and the second fin group.

In the invention above, preferably, the second fin group is formed to be displaced from the first fin group in a direction perpendicular to the flow path of the coolant.

In the invention above, preferably, the fins above are arranged such that main surfaces thereof are substantially in parallel to one another. The fin above includes an opening. The merge space above is formed by the opening above.

In the invention above, preferably, the opening is formed in a region between a plurality of cooled targets.

In the invention above, preferably, the fins above are formed to have a microchannel structure.

In the invention above, preferably, the heat sink is applied to a cooler for a power converter.

A cooler according to the present invention includes the heat sink described above, a case in which the fins above are arranged, and a coolant supply pipe for supplying the coolant above. A main header portion communicating with the coolant supply pipe above for supplying the coolant above to a plurality of the flow paths above is formed inside the case above. A sub header portion communicating with the main header portion above for supplying the coolant to the merge space above is formed inside the case above.

In the invention above, preferably, the cooler is formed to carry out boiling cooling. The coolant supply pipe above is connected to a coolant supply apparatus for supplying the coolant above while pressurizing the same.

According to the present invention, a heat sink and a cooler capable of achieving uniform cooling can be provided.

It is noted that two or more structures among the structures described above may be combined as appropriate.

BEST MODES FOR CARRYING OUT THE INVENTION

First Embodiment

A heat sink and a cooler in a first embodiment according to the present invention will be described with reference to FIGS. 1 to 7.

The cooler in the present embodiment is a cooler for cooling a heat generator such as an IGBT. The cooler in the present embodiment includes a heat sink. In the present embodiment, water, which is a liquid, is used as the coolant. The cooler in the present embodiment is what is called a forced-cooling-type cooler in which the coolant is supplied by a coolant supply apparatus.

Figure 1:
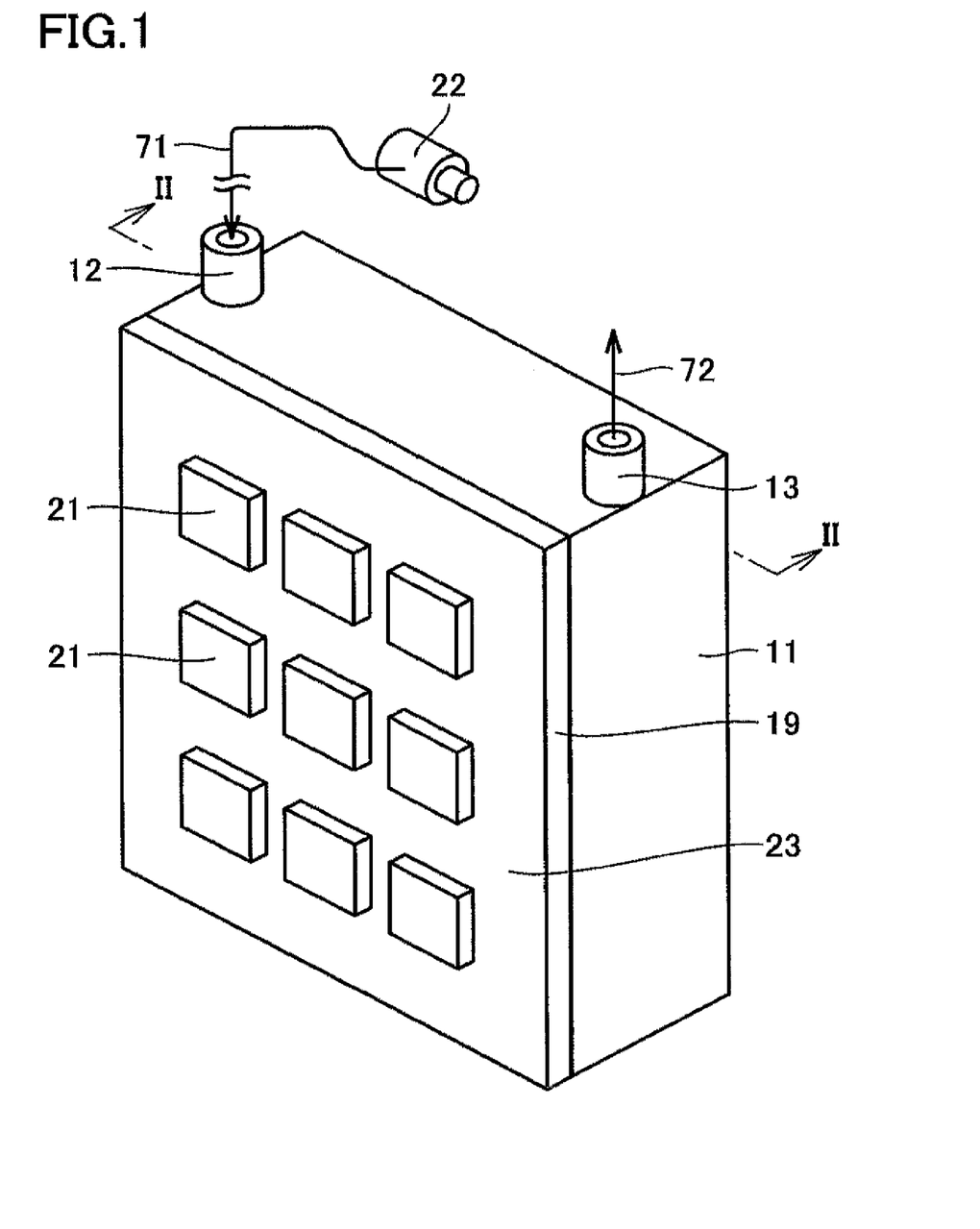
FIG. 1 is a schematic perspective view of a cooler in a first embodiment.

A cooled target in the present embodiment is a semiconductor element 21. The heat sink in the present embodiment includes a plate member 19. Plate member 19 is formed in a flat plate shape. Semiconductor element 21 is joined to a surface of plate member 19. Semiconductor elements 21 are arranged at a distance from one another. In the present embodiment, nine semiconductor elements 21 are joined to plate member 19. The plurality of semiconductor elements 21 are arranged in rows and columns.

The cooler includes a case 11. Case 11 is in a substantially parallelepiped shape. Fins of the heat sink which will be described later are arranged inside case 11. The cooler in the present embodiment includes a coolant supply pipe 12 and a coolant discharge pipe 13. Coolant supply pipe 12 and coolant discharge pipe 13 are arranged to project from one surface of case 11. Coolant supply pipe 12 is connected to a supply pump 22 serving as the coolant supply apparatus. Supply pump 22 is formed to supply the coolant to the cooler while pressurizing the same.

Figure 2:
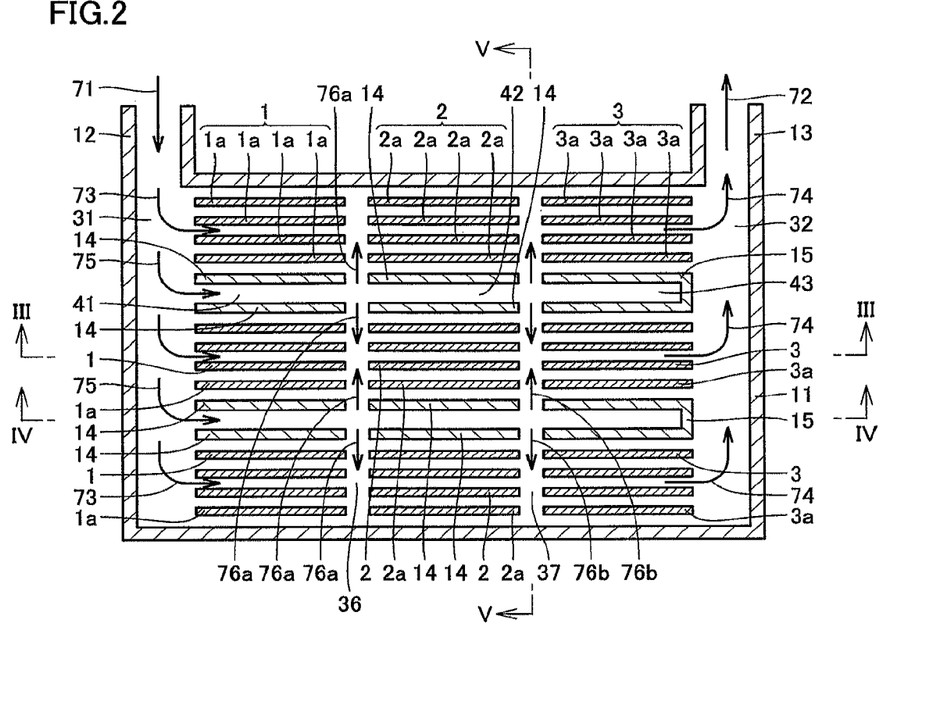
FIG. 2 is a first schematic cross-sectional view of the cooler in the first embodiment.

FIG. 2 shows a first schematic cross-sectional view of the cooler in the present embodiment. FIG. 2 is a cross-sectional view along the line II-II in FIG. 1 when viewed in a direction of an arrow.

The heat sink in the present embodiment includes a plurality of fin groups. The heat sink includes a first fin group 1. First fin group 1 includes a plurality of first fins 1a. First fin 1a is formed in a flat plate shape. A plurality of first fins 1a are arranged such that main surfaces thereof are in parallel to one another. A flow path of the coolant is formed by a space lying between case 11 and first fin 1a or a space lying between first fins 1a.

The heat sink in the present embodiment includes a second fin group 2. Second fin group 2 includes a plurality of second fins 2a. Second fin group 2 in the present embodiment is structured similarly to first fin group 1. Second fin 2a is structured similarly to first fin 1a. The cooler in the present embodiment includes a third fin group 3. Third fin group 3 includes a plurality of third fins 3a. Third fin group 3 is structured similarly to first fin group 1. Third fin 3a is structured similarly to first fin 1a.

Each fin group in the present embodiment is joined to a back surface of plate member 19. Each fin group is arranged to stand on the main surface on the back side of plate member 19.

First fin group 1, second fin group 2 and third fin group 3 in the present embodiment are arranged in line. In the present embodiment, first fin 1a, second fin 2a and third fin 3a are arranged in line. First fin 1a, second fin 2a and third fin 3a are arranged on the same plane from a supply side main header portion 31 which will be described later toward a discharge side main header portion 32 which will be described later.

First fin group 1 and second fin group 2 are arranged at a distance from each other. Second fin group 2 and third fin group 3 are arranged at a distance from each other. A merge space 36 allowing the coolant that flows through respective flow paths to merge is formed between first fin group 1 and second fin group 2. In addition, a merge space 37 is formed between second fin group 2 and third fin group 3. Merge spaces 36, 37 in the present embodiment are formed at a predetermined interval along the flow path of the coolant. Merge space 36, 37 is formed in the flow paths from supply side main header portion 31 toward discharge side main header portion 32. Merge space 36, 37 is formed in the flow paths of the coolant formed by the fins.

In the present embodiment, three first fin groups 1, three second fin groups 2 and three third fin groups 3 are arranged in rows and columns to form the fin group. In FIG. 2, first fin group 1, second fin group 2 and third fin group 3 are arranged in a lateral direction. The fin groups of each kind are arranged in a vertical direction. In the present embodiment, first fin group 1, second fin group 2 and third fin group 3 are arranged along the flow paths through which the coolant flows. In the present embodiment, nine fin groups are formed.

Referring to FIGS. 1 and 2, the fin groups are arranged in regions corresponding to positions of semiconductor elements 21 arranged on the surface of the cooler respectively. The fin groups are arranged to include regions on the back side of plate member 19 that correspond to projection of regions where semiconductor elements 21 are arranged on plate member 19. In the present embodiment, semiconductor elements 21 are arranged inside the regions where respective fin groups are formed, when cooler 1 is two-dimensionally looked through.

The cooler in the present embodiment includes supply side main header portion 31 as a main header portion on a supply side. Supply side main header portion 31 communicates with coolant supply pipe 12. Supply side main header portion 31 is formed to be able to store the coolant. Supply side main header portion 31 communicates with the flow path of the coolant formed by first fin 1a and case 11.

The cooler in the present embodiment includes a sub header portion for supplying the coolant to each of merge spaces 36 and 37. In the cooler in the present embodiment, sub header portions 41 to 43 are formed by separating members 14, 15 arranged between the fin groups.

In the present embodiment, separating members 14, 15 are implemented by forming cut portions for supplying the coolant to merge spaces 36, 37 in plate-shaped members forming sub header portions 41 to 43.

The cooler in the present embodiment includes separating member 14 arranged between first fin groups 1. Sub header portion 41 is formed by a space lying between two separating members 14. Two separating members 14 are arranged at a distance from each other. Separating members 14 are arranged such that a main surface thereof is substantially in parallel to the main surface of first fin 1a. Similarly to separating member 14 arranged between first fin groups 1, two separating members 14 are arranged between second fin groups 2. Sub header portion 42 is formed by a space lying between two separating members 14.

Separating member 15 is arranged between third fin groups 3. Separating member 15 is formed to have a bracket-shaped cross-section. Sub header portion 43 is formed by a space inside separating member 15. Separating member 15 is formed such that an end portion of sub header portions 41 to 43 is closed.

Separating member 14 arranged between first fin groups 1 and separating member 14 arranged between second fin groups 2 are arranged at a distance from each other. Separating member 14 arranged between second fin groups 2 and separating member 15 are arranged at a distance from each other. Separating members 14, 15 are arranged to allow supply of the coolant to each merge space 36, 37.

Supply side main header portion 31 communicates with sub header portions 41 to 43 formed by separating members 14 and separating member 15. Supply side main header portion 31 is formed to allow supply of the coolant that flows in from coolant supply pipe 12 to sub header portions 41 to 43.

In the present embodiment, separating members 14, 15 implementing sub header portions 41 to 43 are arranged between regions where semiconductor elements 21 are arranged. Namely, separating members 14, 15 are arranged in a portion except for the regions where semiconductor elements 21 are arranged. Sub header portions 41 to 43 are formed in a portion except for the regions where semiconductor elements 32 are arranged.

The cooler includes discharge side main header portion 32 serving as a header portion on a discharge side. Discharge side main header portion 32 communicates with coolant discharge pipe 13. Discharge side main header portion 32 is arranged downstream of the region where the fins are arranged. Discharge side main header portion 32 communicates with the flow path of the coolant formed by third fin 3a and case 11.

Figure 3:
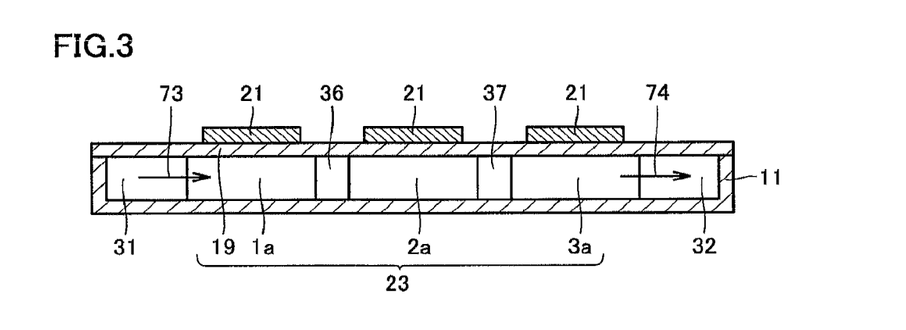
FIG. 3 is a second schematic cross-sectional view of the cooler in the first embodiment.

FIG. 3 shows a second schematic cross-sectional view of the cooler in the present embodiment. FIG. 3 is a cross-sectional view along the line III-III in FIG. 2 when viewed in a direction of an arrow. A heat sink 23 includes first fin 1a, second fin 2a and third fin 3a. First fin 1a, second fin 2a and third fin 3a are joined to plate member 19 such that they are arranged inside case 11. Case 11 is formed to have a bracket-shaped cross-section. Plate member 19 is joined to an end surface of case 11.

In FIG. 3, first fin 1a, second fin 2a and third fin 3a are arranged directly under respective semiconductor elements 21. First fin 1a, second fin 2a and third fin 3a are arranged to extend from the back surface of plate member 19 to an inner surface of case 11. Each of first fin 1a, second fin 2a and third fin 3a in the present embodiment is in contact with the inner surface of case 11.

Merge space 36 is formed by arranging first fin 1a and second fin 2a at a distance from each other. In addition, merge space 37 is formed by arranging second fin 2a and third fin 3a at a distance from each other. When viewed in cross-section, each fin is formed such that a length thereof is greater than a length of semiconductor element 21 in a corresponding direction.

Figure 4:
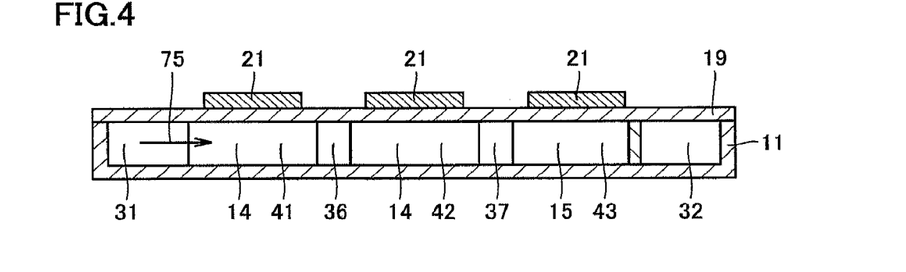
FIG. 4 is a third schematic cross-sectional view of the cooler in the first embodiment.

FIG. 4 shows a third schematic cross-sectional view of the cooler in the present embodiment. FIG. 4 is a cross-sectional view along the line IV-IV in FIG. 2 when viewed in a direction of an arrow.

In the present embodiment, separating members 14, 15 are joined to the back surface of plate member 19 and the inner surface of case 11. By arranging separating members 14 at a distance from each other, a cut portion is formed between the separating members forming sub header portions 41 to 43, and sub header portions 41 to 43 communicate with merge space 36. In addition, by arranging separating member 14 and separating member 15 at a distance from each other, a cut portion is formed between the separating members forming sub header portions 41 to 43, and sub header portions 41 to 43 communicate with merge space 37.

Referring to FIG. 2, the coolant is supplied through coolant supply pipe 12 as shown with an arrow 71. The coolant flows through supply side main header portion 31 to the region where first fan group 1 is arranged, as shown with an arrow 73. The coolant flows into a space lying between case 11 and first fin 1a, a space lying between first fins 1a, and a space lying between separating member 14 and first fin 1a. The coolant flows along the main surface of each fin 1a. In the present embodiment, the coolant flows linearly. Thus, in the present embodiment, the fin serves as the partition wall of the flow path of the coolant.

The coolant absorbs heat from first fin 1a. As a result of cooling of first fin group 1, semiconductor element 21 joined to the surface of plate member 19 in correspondence with first fin group 1 can mainly be cooled.

The coolant that passed through first fin group 1 flows into merge space 36. In merge space 36, the coolant that passed through respective flow paths in first fin group 1 merges.

The coolant stored in merge space 36 flows into second fin group 2. As a result of passage through second fin group 2, each second fin 2a is cooled. As a result of cooling of second fin group 2, semiconductor element 21 joined to the surface of plate member 19 in correspondence with second fin group 2 can mainly be cooled.

The coolant that passed through second fin group 2 flows into merge space 37. In merge space 37, the coolant that passed through respective flow paths in second fin group 2 merges.

The coolant stored in merge space 37 flows into third fin group 3. As a result of passage through third fin group 3, each third fin 3a is cooled. As a result of cooling of third fin group 3, semiconductor element 21 joined to the surface of plate member 19 in correspondence with third fin group 3 can mainly be cooled.

The coolant that passed through third fin group 3 reaches discharge side main header portion 32 as shown with an arrow 74. The coolant is discharged from discharge side main header portion 32 through coolant discharge pipe 13 to the outside of the cooler, as shown with an arrow 72.

On the other hand, a part of the coolant that flowed into the cooler flows into sub header portions 41 to 43 through supply side main header portion 31 as shown with an arrow 75. In the present embodiment, noticeable heat exchange is not carried out in sub header portions 41 to 43. A part of the coolant flows into merge space 36 after the coolant passes through sub header portion 41, as shown with an arrow 76a. Namely, the coolant of which heat exchange has not substantially yet been carried out is injected into a space between first fin group 1 and second fin group 2 from sub header portions 41 to 43.

The coolant flows into sub header portion 42 from sub header portion 41. The coolant that passed through sub header portion 42 flows into merge space 37 as shown with an arrow 76b. Namely, the coolant of which heat exchange has not substantially been carried out is injected also into the merge space formed between second fin group 2 and third fin group 3 from sub header portions 41 to 43.

As the end portion of sub header portion 43 is closed, the coolant that passes through sub header portions 41 to 43 can be prevented from directly flowing into discharge side main header portion 32. In the present embodiment, the coolant that flowed into sub header portion 41 flows into merge spaces 36, 37 in its entirety.

Sub header portions 41 to 43 in the present embodiment are formed to have a cross-sectional area greater than that of the flow paths of the coolant of which heat exchange is carried out. Namely, the sub header portions are formed such that a distance between the separating members forming the sub header portions is greater than a distance between the fins in each fin group.

Figures 5, 6:
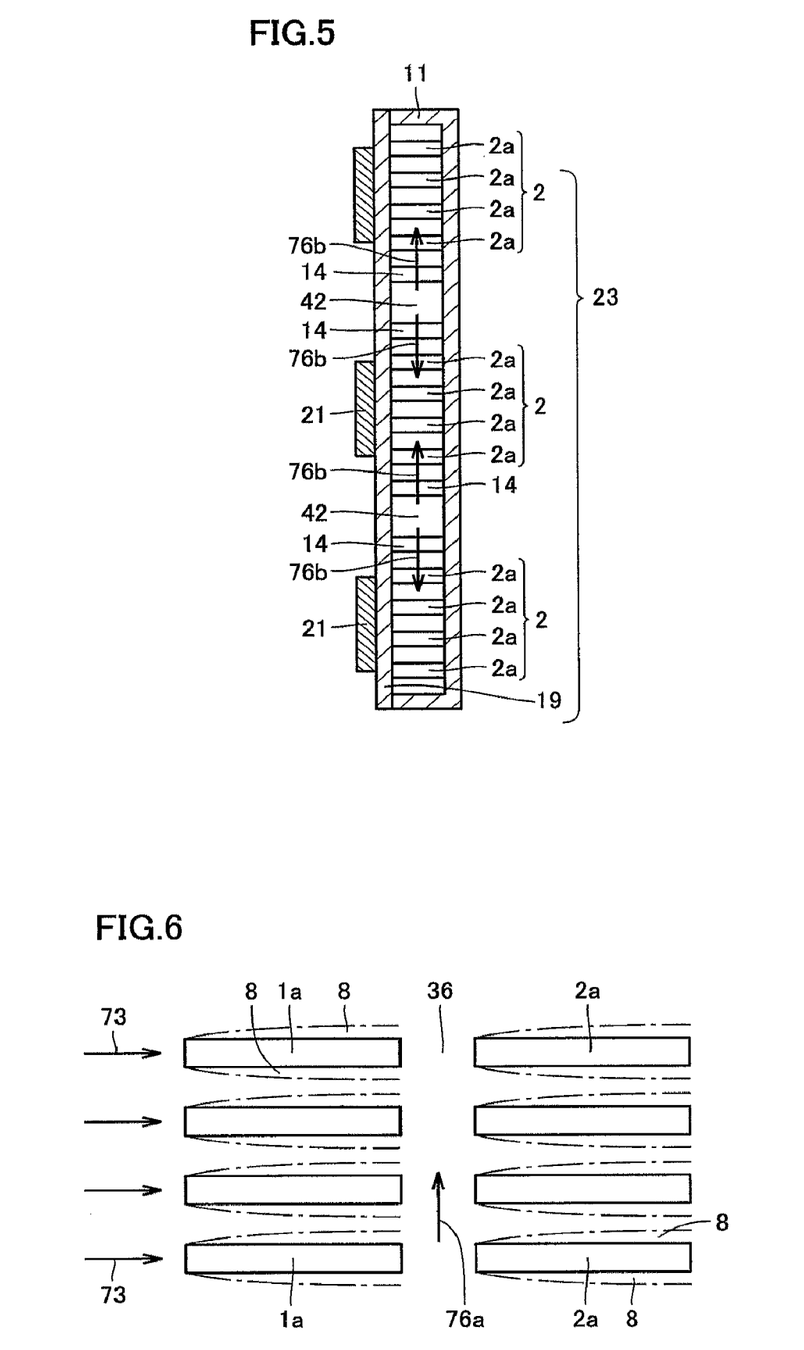
FIG. 5 is a fourth schematic cross-sectional view of the cooler in the first embodiment.
FIG. 6 is an enlarged schematic diagram illustrating a state of a coolant at an end portion of a fin in the present invention.

FIG. 5 shows a fourth schematic cross-sectional view of the cooler in the present embodiment. FIG. 5 is a cross-sectional view along the line V-V in FIG. 2 when viewed in a direction of an arrow. Each flow path in the present embodiment is formed to have a rectangular cross-section.

Referring to FIG. 2, in the cooler in the present embodiment, a temperature of the coolant that flowed from supply side main header portion 31 into first fin group 1 is raised as it travels through the flow path. On the other hand, pressure is lowered. Difference in pressure loss of the coolant in the flow paths may be caused depending on a difference in a state of heat exchange or a structure of the flow paths. The coolant that flowed through the flow paths different from each other merges in merge space 36, so that the pressure can approximately be uniform. In other words, as a result of flow into merge space 36 after passage through first fin group 1, variation in pressure loss during flow between first fins 1a can be mitigated.

As the coolant that flows into second fin group 2 comes from merge space 36, the coolant can be supplied to each flow path under substantially uniform pressure. Therefore, the coolant can substantially uniformly be supplied to each flow path in the region where second fin group 2 is formed. Flow rate distribution to each flow path can substantially be uniform. Consequently, the cooled target arranged on the surface of the cooler can uniformly be cooled.

In addition, even though transient pressure fluctuation takes place in the flow paths from the coolant supply apparatus, a merge space portion serves as a pressure buffer space. Therefore, a flow rate of the coolant can be equal in each flow path and influence by transient fluctuation can be reduced.

Moreover, temperature difference has been created in the coolant that flowed through respective flow paths in the region where first fin group 1 is formed. The coolant, however, merges in merge space 36, so that the temperature becomes uniform. Consequently, the temperature of the coolant that flows into the region of second fin group 2 can substantially be uniform, and the region where second fin group 2 is formed can substantially uniformly be cooled.

In the region where second fin group 2 is formed, difference in pressure loss or difference in temperature is again created in the flow paths. When the coolant reaches merge space 37, however, such difference in pressure loss or difference in temperature can again be eliminated. Therefore, the coolant at an equal flow rate can be distributed to third fin group 3 and the coolant at a substantially even temperature can be supplied to third fin group 3. Consequently, the region where third fin group 3 is formed can substantially uniformly be cooled.

FIG. 6 shows an enlarged schematic diagram of each fin. Merge space 36 is formed between first fin 1a and second fin 2a. The coolant flows along a direction in which first fin 1a and second fin 2a are aligned. The coolant travels in between first fins 1a in a direction shown with arrow 73.

When the coolant flows along the surface of first fin 1a, a boundary layer 8 develops in the vicinity of the surface of first fin 1a. Boundary layer 8 has a thickness that increases toward downstream. Consequently, heat transfer at the surface of the fin becomes poorer. Namely, as boundary layer 8 becomes thicker, thermal resistance becomes greater and heat transfer from first fin 1a to the coolant becomes poorer.

Figure 7:
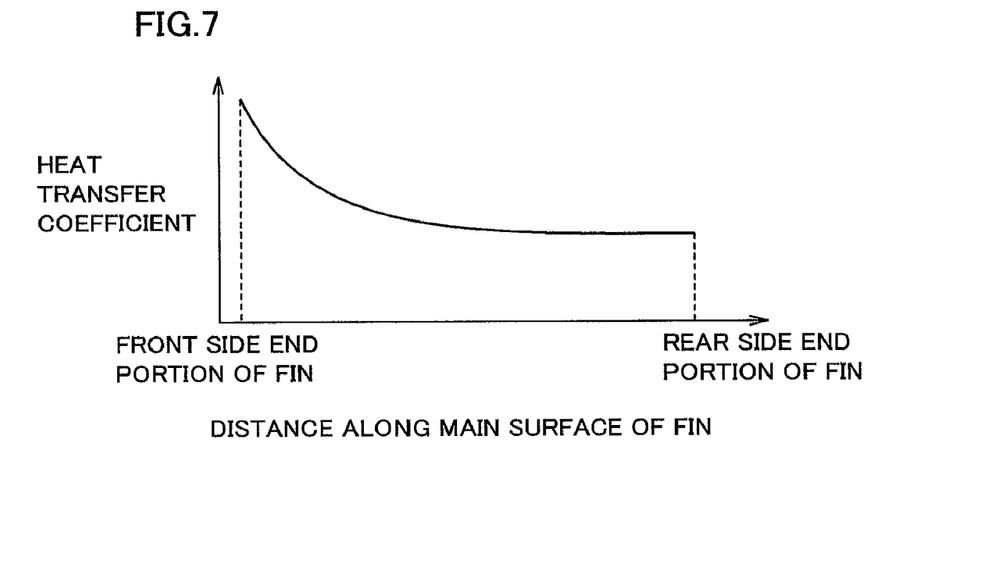
FIG. 7 is a graph illustrating heat transfer in a region from a front side end portion toward a rear side of the fin in the present invention.

FIG. 7 shows a graph of a heat transfer coefficient at the surface in a direction of flow from a front side end portion of each fin. At the front side end portion of the fin, a heat transfer coefficient is high. The heat transfer coefficient becomes lower toward downstream.

Referring to FIG. 6, in the present embodiment, grown boundary layer 8 can be divided at the portion of merge space 36. Consequently, lowering in the heat transfer coefficient in second fin 2a can be suppressed. In the present embodiment, after boundary layer 8 is divided at merge space 36, the coolant collides with the front side end portion of second fin 2a. Boundary layer 8 newly develops along the surface of second fin 2a.

As the boundary layer is thin at the front side end portion of second fin 2a, high heat transfer can be achieved (leading edge effect). As the coolant flows through the region where second fin 2a is formed, new boundary layer 8 is created and develops. The boundary layer, however, can again be divided at merge space 37 formed between second fin group 2 and third fin group 3. Thereafter, the leading edge effect can again be obtained at the front side end portion of third fin 3a.

Thus, the cooler in the present embodiment can repeatedly obtain the leading edge effect at the end portion of the fin in contact with the merge space, and a high heat transfer coefficient can be achieved. Consequently, high cooling performance can be obtained.

In the present embodiment, the heat sink includes a plurality of fins and the merge space is formed such that the coolant in the flow paths separated by the fins merges. The merge space is formed in the flow paths formed by the fins. By adopting this structure, the heat sink capable of achieving uniform cooling, having improved cooling performance, can be provided.

In addition, in the present embodiment, the first fin group including a plurality of first fins and the second fin group including a plurality of second fins are provided. The second fin group is arranged such that the main surface of the second fin is substantially in parallel to the main surface of the first fin. The merge space is formed by arranging the first fin group and the second fin group at a distance from each other. According to this structure, the merge space can readily be formed.

Figure 13:
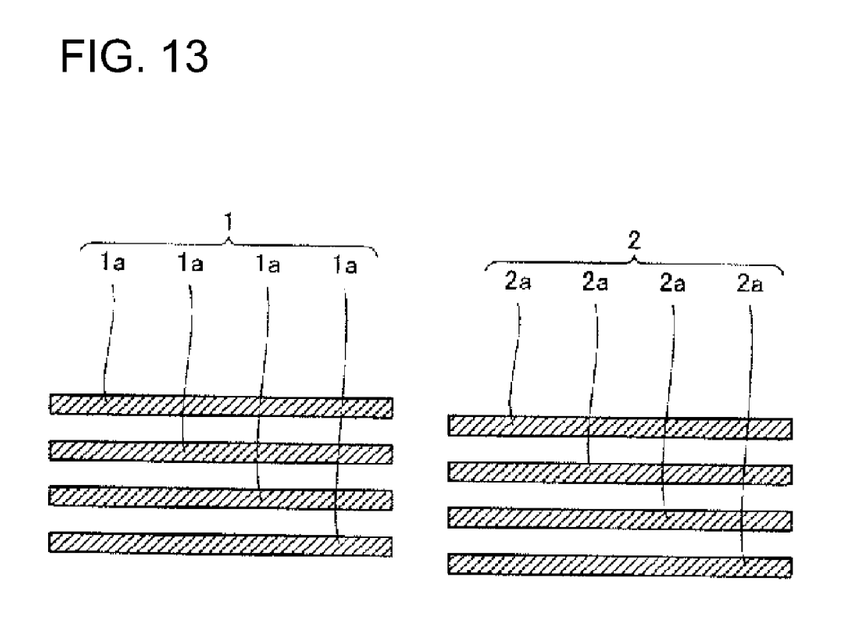
FIG. 13 is a schematic view of an alternative embodiment in which the second fin group is displaced from the first fin group in a direction perpendicular to the flow path of coolant.

The first fin group and the second fin group are not limited to such a form, and it is not necessary to arrange the first fin in the first fin group and the second fin in the second fin group in line. For example, the second fin group may be formed such that it is displaced from the first fin group in a direction perpendicular to the flow path of the coolant. By doing so, turbulence of the flow of the coolant can be promoted, to thereby improve cooling performance.

Moreover, in the present embodiment, the first fin group and the second fin group are similarly structured, however, they are not limited as such. The first fin group and the second fin group may have a structure different from each other. For example, the number of first fins included in the first fin group may be different from the number of second fins included in the second fin group.

Referring to FIG. 2, the cooler in the present embodiment includes sub header portions 41 to 43 for supplying the coolant to the merge space. As each of sub header portions 41 to 43 communicates with supply side main header portion 31, the coolant of which heat exchange has not substantially been carried out can be supplied to the merge space. By injecting the coolant at a low temperature into the merge space, increase in the temperature of the coolant can be suppressed also on the downstream side. Consequently, substantially uniform cooling can be achieved also in a direction of flow of the coolant.

Pressure lowering in the coolant resulting from pressure loss is more significant toward downstream. Therefore, in the merge space on the downstream side, difference in pressure from the sub header portion is greater, and an amount of supply of the coolant can be increased. As the temperature of the coolant is higher on the downstream side of the coolant, a greater amount of coolant at a low temperature can be supplied from the sub header portion to a portion at a high temperature and increase in the coolant temperature can effectively be suppressed. Consequently, a temperature at the exit of the cooler can be lower and the cooler can be designed with sufficient margin.

The sub header portion preferably has at least such a size that pressure lowering therein is smaller than pressure lowering in the flow paths formed by the fins. Alternatively, pressure lowering caused in the sub header portion is preferably substantially ignorable. In the present embodiment, for example, the sub header portion is preferably approximately at least five times greater in a cross-sectional area perpendicular to the direction of flow of the coolant, than that of the flow path implemented by the space between the fins.

In an example where the cooler in the present invention is a boiling-type cooler, shortage of the coolant can be mitigated. In addition, burnout can effectively be avoided.

In the boiling-type cooler, the coolant boils inside the cooler and a dual-phase state in which liquid phase and gas phase are both present is established. In what is called boiling cooling in which cooling is continued in such a state, uniform and high-performance cooling can be achieved based on effects of heat absorption by latent heat in connection with phase change and a temperature held at a boiling point. When an amount of heat generation by the heat generator connected to the cooler is great, however, burnout, in which transition from nucleate boiling to film boiling is made, may occur at the surface of the fin serving as a heat transfer surface. If burnout occurs, the surface of the fin is covered with vapor and heat transfer becomes extremely poorer. Thus, in boiling cooling, it is important to hold a liquid coolant at the surface of the fin.

In the cooler of the present invention, a uniform flow rate in each flow path can be achieved, and hence burnout resulting from partial shortage of the coolant in the flow path at a low flow rate can be suppressed. In addition, the coolant can be supplied from the sub header portion through the merge space to each flow path, and occurrence of burnout due to shortage of the coolant can be suppressed.

Moreover, as the temperature of the coolant is higher toward downstream as described previously, a ratio of liquid phase out of two phases of gas and liquid becomes lower. Accordingly, burnout is more likely on the downstream side. On the other hand, as the pressure of the coolant is lower toward downstream, supply of the coolant from the sub header portion can be increased toward downstream and burnout can effectively be suppressed. In the case of boiling cooling, a large amount of coolant at a low temperature can be fed to a portion where burnout is likely, and the coolant can appropriately be supplied in accordance with a boiling state.

The cooler in the present invention is applicable to a cooler having a microchannel structure having a small flow path cross-sectional area. In the microchannel structure, a hydraulic diameter D is, for example, not smaller than 0.6 mm and not greater than 3 mm. Alternatively, in a microchannel structure having a further smaller flow path, hydraulic diameter D is not greater than 0.6 mm.

Hydraulic diameter D is expressed in the following equation:

$$D=4A/L \qquad (1)$$

(where A represents a flow path cross-sectional area and L represents a length of a perimeter of cross-section (a wet perimeter length or a cross-sectional length)).

As each flow path has a small size in the microchannel structure, a greater heat transfer area can be achieved by integrating these flow paths. Alternatively, a heat transfer coefficient can be set higher. The cooler having a microchannel structure can achieve a smaller size and improvement in cooling capability. In the microchannel structure, however, the flow path is small. Therefore, pressure loss during passage through the flow path is great and it is difficult to distribute the coolant equally to each flow path.

According to the present invention, the merge space is formed in the flow path, so that the coolant can equally be supplied to each flow path even in the cooler having the microchannel structure.

In addition, in a boiling-type cooler having a microchannel structure, the flow path has a small cross-sectional area and hence burnout is likely. Specifically, as the flow path has a small cross-sectional area, the flow path is readily blocked by gas phase due to boiling and burnout is likely. According to the present invention, however, as the coolant at a low temperature is supplied from the sub header portion to the merge space formed between the fins, burnout can effectively be suppressed.

Though each fin in the present embodiment is formed in a flat plate shape, the fin is not limited as such. Any fin may be adopted so long as the fin is formed to allow the coolant to flow along its surface. In addition, a height of each fin is not restricted, and the present invention is applicable to a heat sink having a fin of any height.

In the present embodiment, each separating member is formed by forming a cut portion for supplying the coolant to the merge space in a plate-shaped member forming the sub header portion, however, the separating member is not limited as such. The member implementing the sub header portion should only be formed to supply the coolant from the sub header portion to the merge space. For example, an opening (hole portion) or a step for supplying the coolant to the merge space may be formed in a member forming the sub header portion.

In the present embodiment, each flow path is formed to have a rectangular cross-section, however, the flow path is not limited as such. A flow path having any cross-sectional shape such as an annular shape or a trapezoidal shape may be adopted.

In addition, in the present embodiment, the coolant supply pipe for supplying the coolant to the cooler and the coolant discharge pipe are formed in one surface of the case, however, the embodiment is not particularly limited as such. The coolant supply pipe should only be formed to be able to supply the coolant to each fin. In addition, the coolant discharge pipe should only be formed to be able to discharge the coolant that passed in between the fins.

Moreover, in the present embodiment, a semiconductor element has been described by way of example of a cooled target, however, the embodiment is not limited as such. The present invention is applicable to a heat sink and a cooler for cooling any cooled target. For example, the present invention is applicable to a cooler for cooling a CPU of a computer or a cooler for a power converter such as an inverter.

Second Embodiment

A heat sink and a cooler in a second embodiment according to the present invention will be described with reference to FIGS. 8 and 9. The cooler in the present embodiment is different from that in the first embodiment in the structure of each fin and the structure of a partition wall implementing the sub header portion.

Figure 8:
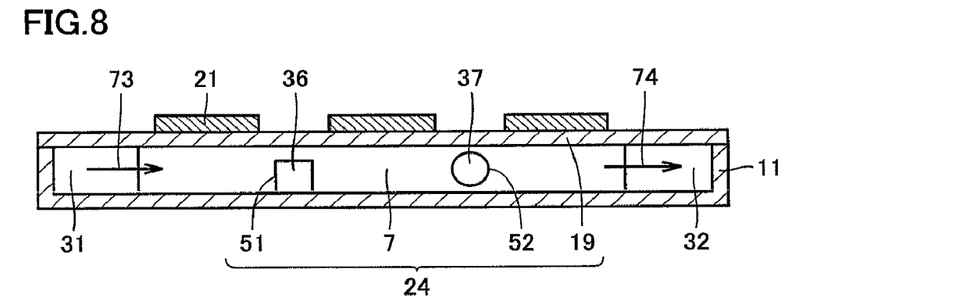
FIG. 8 is a first schematic cross-sectional view of a cooler in a second embodiment.

FIG. 8 shows a first schematic cross-sectional view of the cooler in the present embodiment. FIG. 8 is a schematic cross-sectional view corresponding to the cross-sectional view in FIG. 3 in the first embodiment. The cooler in the present embodiment includes a heat sink 24. Heat sink 24 includes a plurality of fins 7.

Fins 7 are formed to extend from supply side main header portion 31 to discharge side main header portion 32. Fins 7 are arranged inside case 11. A plurality of fins 7 are arranged such that main surfaces thereof are in parallel to one another (not shown).

Fin 7 has an opening 51 for forming merge space 36. Fin 7 includes an opening 52 for forming merge space 37. Opening 51, 52 is formed in a region between semiconductor elements 21. Opening 51 is formed to have a quadrangular two-dimensional shape. Opening 52 is formed to have an annular two-dimensional shape.

Figure 9:
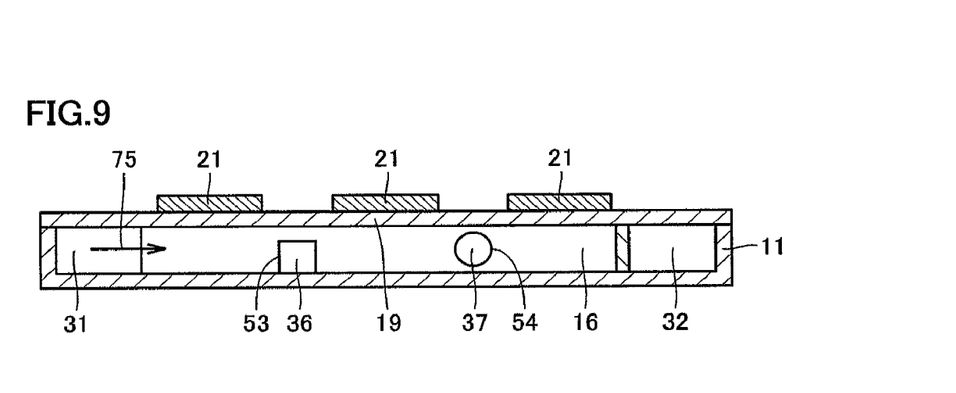
FIG. 9 is a second schematic cross-sectional view of the cooler in the second embodiment.

FIG. 9 is a second schematic cross-sectional view of the cooler in the present embodiment. FIG. 9 is a schematic cross-sectional view corresponding to the cross-sectional view in FIG. 4 in the first embodiment. The cooler in the present embodiment includes a separating member 16.

Separating member 16 is formed to have a bracket-shaped cross-section. Separating member 16 is formed to extend from supply side main header portion 31 to discharge side main header portion 32.

Separating member 16 has an opening 53 for communicating with merge space 36. Separating member 16 has an opening 54 for communicating with merge space 37. Openings 53, 54 are formed in substantially parallel, surface-like portions of the bracket opposed to each other. Opening 53 is formed to have a quadrangular two-dimensional shape. Opening 53 is formed at an end portion in a direction of width of separating member 16. Opening 54 is formed to have an annular two-dimensional shape. Opening 54 is formed in a substantially central portion in the direction of width of separating member 16.

Thus, in the cooler of the present embodiment, the opening is formed in the fin. Each merge space is formed by the opening formed in the fin. According to this structure as well, a function and effect the same as in the first embodiment can be obtained. In addition, the coolant can be supplied to the merge space by forming an opening also in the separating member for implementing the sub header portion.

The opening formed in the fin and the separating member in the present embodiment is formed to have a quadrangular or annular two-dimensional shape, however, the shape is not limited as such. An opening of any shape may be adopted.

In the present embodiment, the openings formed in the fins are formed to be substantially identical in a shape and a size and the openings formed in the separating members are formed to be substantially identical in a shape and a size, however, the opening is not limited as such. The opening formed in each member may be different in a shape and a size. In addition, as shown in the first embodiment, a cut portion may be formed instead of some openings.

As the structure and the function and effect are otherwise the same as those in the first embodiment, description thereof will not be repeated here.

Third Embodiment

A heat sink and a cooler in a third embodiment according to the present invention will be described with reference to FIGS. 10 to 12. The cooler in the present embodiment is different from that in the first embodiment in the structure of the sub header portion.

Figure 10:
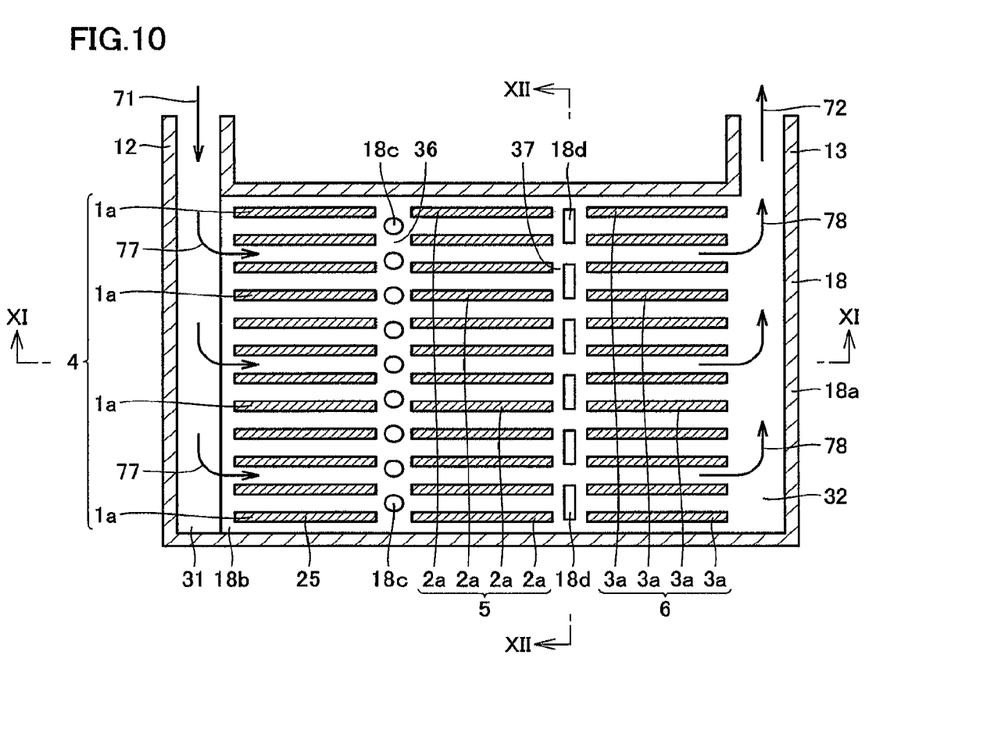
FIG. 10 is a first schematic cross-sectional view of a cooler in a third embodiment.

FIG. 10 shows a first schematic cross-sectional view of the cooler in the present embodiment. The cooler in the present embodiment includes a heat sink 25. Heat sink 25 includes a plate member 25. Heat sink 25 includes a first fin group 4. First fin group 4 includes a plurality of first fins 1a. The plurality of first fins 1a are arranged such that main surfaces thereof are in parallel to one another.

Heat sink 25 includes a second fin group 5. Second fin group 5 includes a plurality of second fins 2a. Second fin group 5 is structured similarly to first fin group 4. Heat sink 25 includes a third fin group 6. Third fin group 6 includes a plurality of third fins 3a. Third fin group 6 is structured similarly to first fin group 4.

Merge space 36 is formed between first fin group 4 and second fin group 5. Merge space 37 is formed between second fin group 5 and third fin group 6. The cooler in the present embodiment includes a case 18. First fin group 4, second fin group 5 and third fin group 6 are arranged inside case 18.

Figure 11:
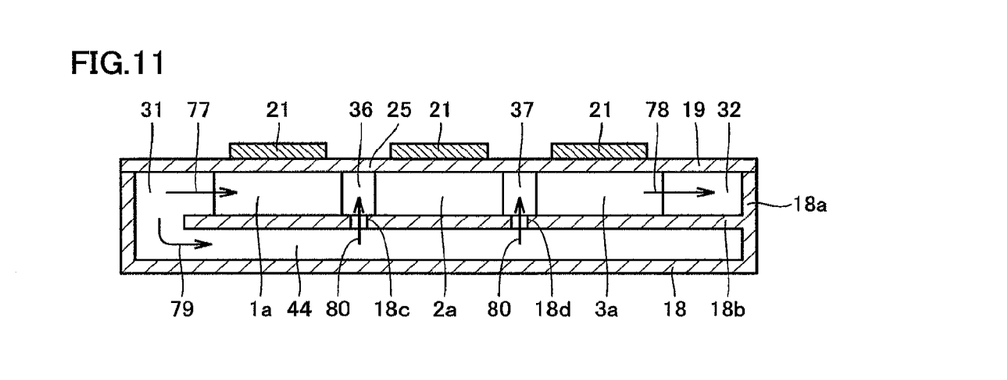
FIG. 11 is a second schematic cross-sectional view of the cooler in the third embodiment.

FIG. 11 shows a second schematic cross-sectional view of the cooler in the present embodiment. FIG. 11 is a cross-sectional view along the line XI-XI in FIG. 10 when viewed in a direction of an arrow. Case 18 in the present embodiment has a sidewall 18a. Case 18 has a partition wall 18b. Partition wall 18b is formed in a plate shape. Partition wall 18b is joined to sidewall 18a. Partition wall 18b in the present embodiment is formed such that a main surface thereof is substantially in parallel to a main surface of plate member 19.

Partition wall 18b divides an inner space in case 18. The fin group such as first fin group 4 including first fins 1a is arranged in one space. The other space implements a sub header portion 44. Sub header portion 44 is formed by a space lying between partition wall 18b and an outer wall of case 18.

Partition wall 18b has openings 18c, 18d for supplying the coolant to merge spaces 36, 37 respectively. Openings 18c, 18d are formed between regions where semiconductor elements 21 are arranged.

Referring to FIG. 10, openings 18c are formed at a distance from one another, and openings 18d are formed at a distance from one another. Opening 18c is formed to have an annular two-dimensional shape. Opening 18d is formed to have a rectangular two-dimensional shape.

Figure 12:
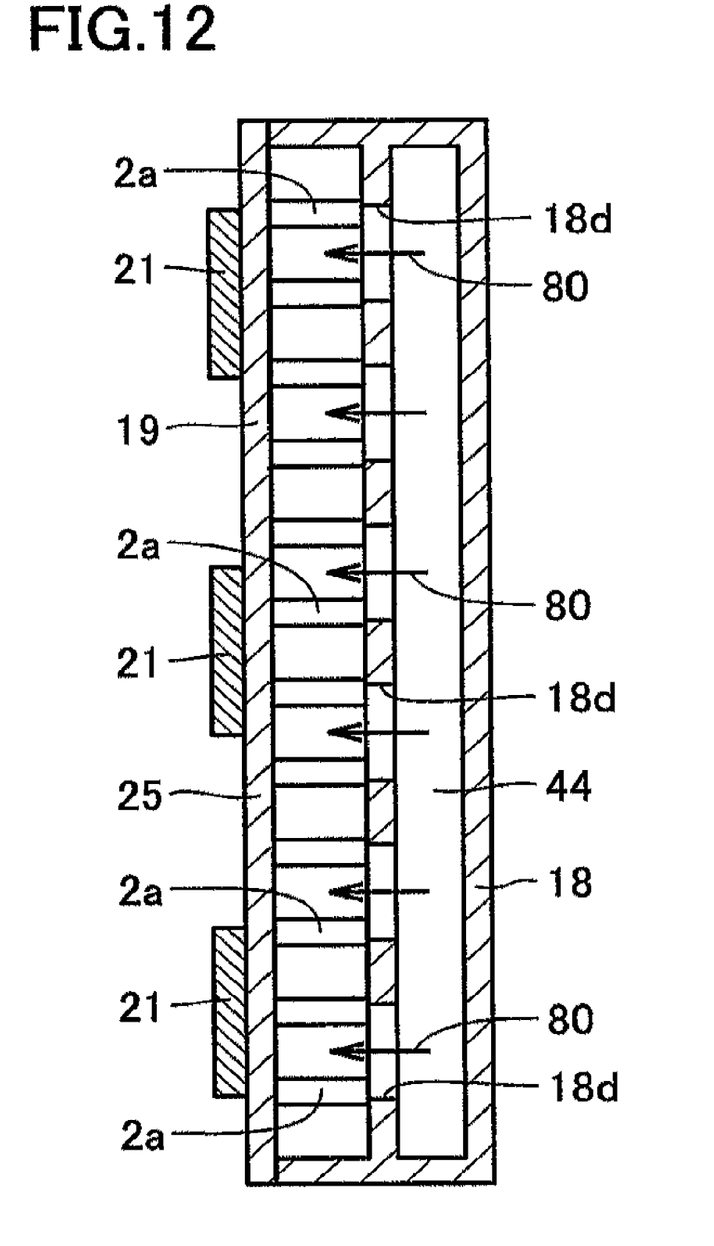
FIG. 12 is a third schematic cross-sectional view of the cooler in the third embodiment.

FIG. 12 shows a third schematic cross-sectional view of the cooler in the present embodiment. FIG. 12 is a cross-sectional view along the line XII-XII in FIG. 10 when viewed in a direction of an arrow. Openings 18d are formed at predetermined intervals from one another. In addition, openings 18c are also formed at predetermined intervals.

Referring to FIG. 10, the coolant is supplied from coolant supply pipe 12 to supply side main header portion 31 as shown with arrow 71. The coolant flows into a region where first fin group 4 is formed, from supply side main header portion 31 as shown with an arrow 77. The coolant reaches merge space 36 after it passes through first fin group 4. The coolant flows into a region where second fin group 5 is formed, from merge space 36. The coolant that passed through second fin group 5 reaches merge space 37. The coolant flows into a region where third fin group 6 is formed, from merge space 37.

The coolant flows from the region where third fin group 6 is formed to discharge side main header portion 32 as shown with an arrow 78. The coolant is discharged from discharge side main header portion 32 through coolant discharge pipe 13 as shown with arrow 72. In each merge space 36, 37, the coolant that passed through respective flow paths merges.

Referring to FIGS. 11 and 12, a part of the coolant that flowed into supply side main header portion 31 flows into sub header portion 44 as shown with an arrow 79. The coolant that flowed into sub header portion 44 flows into merge space 36 through opening 18c as shown with an arrow 80. In addition, the coolant that flowed into sub header portion 44 flows into merge space 37 through opening 18d. Thus, the coolant of which heat exchange has not substantially been carried out can be supplied from a main header portion to each merge space 36, 37.

In the cooler in the present embodiment, the flow paths directly contributing to cooling of the fins are separated from the sub header portion by partition wall 18b. In the first embodiment, the sub header portion is formed between the fins, however, the sub header portion in the present embodiment is formed in a space separated from the space where the fins are arranged. Therefore, direct thermal influence by the semiconductor element is less likely, and the temperature of the coolant supplied from the sub header portion can be maintained at a lower temperature.

For example, if an amount of heat generation by the heat generator such as a semiconductor element is great and the sub header portion is formed directly under the heat generator, the coolant in the sub header portion may be affected by the heat generator. In the present embodiment, however, the heat of the heat generator can be blocked by partition wall 18b, and the coolant at a low temperature can reliably be supplied to the merge space.

A material for the partition wall is not limited, however, the partition wall is preferably formed of a heat-insulating material. According to this structure, increase in the coolant temperature in the sub header portion can further effectively be suppressed.

In addition, in the present embodiment, as a flow path cross-sectional area of the sub header portion is great, pressure loss in the sub header portion can be less. Consequently, a greater amount of coolant can be supplied from the sub header portion to the merge space also on the downstream side.

In the present embodiment, the opening formed in the partition wall has an annular or a quadrangular two-dimensional shape, however, the opening is not limited as such and any shape may be adopted. For example, the opening may be an elongated hole extending along the merge space.

As the structure and the function and effect are otherwise the same as those in the first and second embodiments, description thereof will not be repeated here.

In the drawings above, the same or corresponding portions have the same reference numerals allotted. In addition, in the description above, the terms such as upper and lower do not necessarily mean absolute upper and lower directions in a vertical direction but relatively mean positional relation between portions.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The present invention is applicable, for example, to a heat sink or a cooler for cooling a semiconductor element implementing an electric device (PCU: power control unit) controlling a rotating electric machine for drive in a hybrid vehicle.

The invention claimed is:

1. A cooler, comprising:
a case including a partition wall that divides an inner space of the case into a first space and a second space; and
a heat sink including
a first fin group including a plurality of first fins arranged such that main surfaces of said plurality of first fins are in parallel to one another; and
a second fin group including a plurality of second fins arranged such that main surfaces of said plurality of second fins are in parallel to one another,
said second fin group being arranged such that the main surface of said second fin is in parallel to the main surface of said first fin,
said first fins and said second fins being formed to serve as partition walls of flow paths of a coolant,
said first fins and said second fins being formed such that said coolant flows along a surface thereof,
a merge space being formed to allow said coolant in said flow paths separated by said first fins to merge,
said merge space being formed in said flow paths formed by said first fins and said second fins by arranging said first fin group and said second fin group at a distance from each other, and
locations of said second fins in said second fin group are not in line with locations of said first fins in said first fin group, whereby said second fins in said second fin group being formed to be displaced from locations of said first fins in said first fin group in a direction perpendicular to the flow paths of said coolant between the partition walls;
the first fins in said first fin group and the second fins in said second fin group are arrange in the first space, and the second space includes a sub header portion formed between the partition wall and an outer wall of the case;
the partition wall includes a plurality of openings that supply the coolant from the sub header portion to the merge space;
a coolant supply pipe for supplying said coolant, and
a main header portion communicating with said coolant supply pipe for supplying said coolant to a plurality of said flow paths is formed inside said case, and
the sub header portion communicating with said main header portion for supplying the coolant to said merge space is formed inside said case;
the main header portion supplies the coolant directly to both said first space and said second space.

2. The cooler according to claim 1, wherein
said first fins and said second fins are formed to have a microchannel structure.

3. The cooler according to claim 1, formed to carry out boiling cooling, wherein
said coolant supply pipe is connected to a coolant supply apparatus for supplying said coolant while pressurizing said coolant.

* * * * *